__United States Patent__ [19]

Neppl et al.

[11] Patent Number: 4,874,717

[45] Date of Patent: Oct. 17, 1989

[54] SEMICONDUCTOR CIRCUIT CONTAINING INTEGRATED BIPOLAR AND MOS TRANSISTORS ON A CHIP AND METHOD OF PRODUCING SAME

[75] Inventors: Franz Neppl; Ulrich Schwabe, both of Munich, Fed. Rep. of Germany

[73] Assignee: Siemens Aktiengesellschaft, Berlin and Munich, Fed. Rep. of Germany

[21] Appl. No.: 265,948

[22] Filed: Nov. 2, 1988

Related U.S. Application Data

[62] Division of Ser. No. 502,511, Jun. 9, 1919, abandoned.

[30] Foreign Application Priority Data

Aug. 12, 1982 [DE] Fed. Rep. of Germany ....... 3230077

[51] Int. Cl.$^4$ .......................................... H01L 21/265
[52] U.S. Cl. ........................................ 437/59; 437/31;
437/200; 437/245; 437/41; 437/45; 148/DIG. 9; 148/DIG. 10; 357/43
[58] Field of Search ...................... 437/31, 32, 33, 59, 437/200, 194, 189, 245, 228, 72, 54; 148/DIG. 10, DIG. 11, DIG. 9; 357/43, 34; 156/657

[56] References Cited

U.S. PATENT DOCUMENTS

| 4,180,596 | 12/1979 | Crowder et al. | 427/42 |
|---|---|---|---|
| 4,283,439 | 8/1981 | Higashinakagawa et al. | 427/89 |
| 4,299,024 | 11/1981 | Piotrowski | 29/577 |
| 4,424,578 | 1/1984 | Miyamoto | 365/104 |
| 4,436,582 | 3/1984 | Saxena | 156/656 |
| 4,471,376 | 9/1984 | Morcom et al. | 357/71 |
| 4,737,472 | 4/1988 | Schaber | 437/59 |
| 4,752,589 | 6/1988 | Schaber | 437/34 |
| 4,772,567 | 9/1988 | Hirag | 437/33 |
| 4,778,774 | 10/1988 | Blossfeld | 437/59 |
| 4,784,971 | 11/1988 | Chin | 437/33 |
| 4,816,423 | 3/1989 | Havemann | 437/59 |

FOREIGN PATENT DOCUMENTS 2077993 12/1981 United Kingdom .

OTHER PUBLICATIONS

Electronics, Jun. 8, 1978, "How The Bi-Fet Process Benefits Linear Circuits", by Rod Russell et al, pp. 113-117.

IEEE Transactions on Electron Devices, vol. Ed-27, No. 8, Aug., 1980, "Application of MoSi$_2$ To The Double-Level Interconnections of I$^2$l Circuits", by Sasaki et al, pp. 1385-1389.

IEEE Trans. on Elec. Devices, vol. ED-27, No. 8, Aug. 1980, "Subnanosecond Self-Aligned I$^2$L/MTL Circuits", by Tang et al, pp. 1379-1384.

Japan application No. 53-119537, Apr. 1, 1980, "Method of Manufacturing Semiconductor Device", Kenji Shibata.

IEEE Journal of Solid-State Circuits, vol. SC-15, No. 4, Aug., 1980, "Refractory Silicides of Titanium and Tantalum for Low-Resistivity Gates and Interconnects", by Murarka et al, pp. 474-482.

Primary Examiner—Brian E. Hearn
Assistant Examiner—Kevin McAndrews
Attorney, Agent, or Firm—Hill, Van Santen, Steadman & Simpson

[57] ABSTRACT

Integrated semiconductor circuits with at least one bipolar transistor (17) and at least one MOS field effect transistor (18) on a chip wherein contacts from a metal interconnect level to diffused active emitter (8) and collector (5) regions of the bipolar transistor (17) as well as the gate electrode (9) of the MOS transistor are composed of a high melting point silicide, such as tantalum, tungsten, molybenum or titanium silicide, are disclosed, along with a method of producing such circuits. In addtion to achieving independence from a metallization grid and achieving low-resistance wiring, the use of the silicide, in conjunction with the high temperature stability of silicides, enables its simultaneous use as an implantation mask. The invention allows the production of bipolar/MOS components on a chip without added outlay.

11 Claims, 1 Drawing Sheet

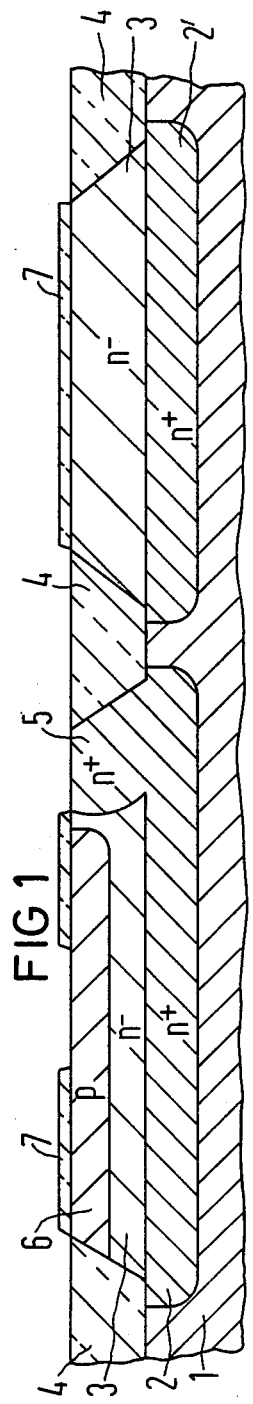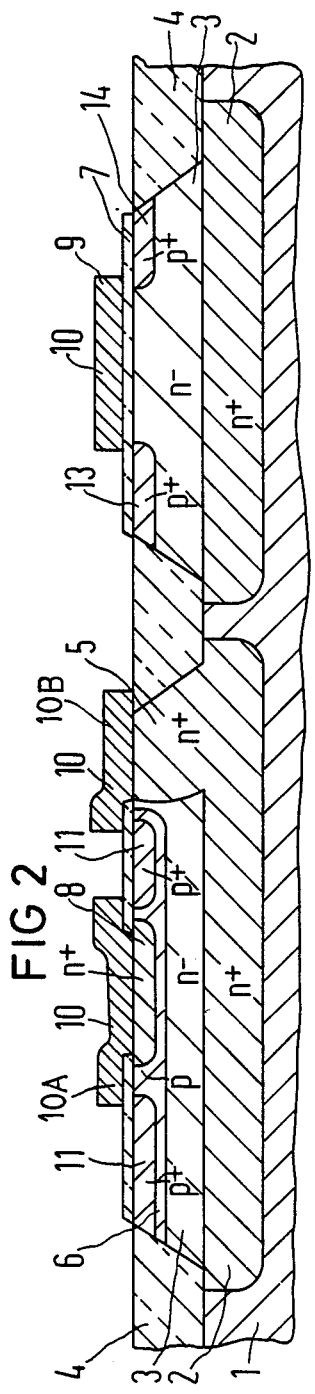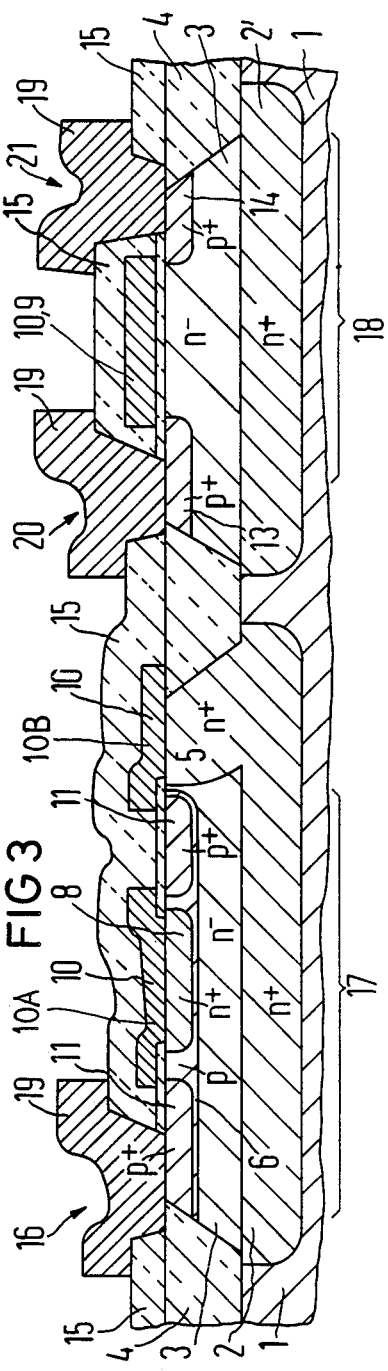

SEMICONDUCTOR CIRCUIT CONTAINING INTEGRATED BIPOLAR AND MOS TRANSISTORS ON A CHIP AND METHOD OF PRODUCING SAME

This is a division, of application Ser. No. 502,511, filed June 9, 1983, now abandoned.

BACKGROUND OF THE INVENTION

1. Field of the Invention

The invention relates to integrated semiconductor circuits and somewhat more particularly to such semiconductor circuits having at least one bipolar transistor and at least one MOS transistor on a chip wherein contacts from a metal interconnect level to diffused active regions of the bipolar transistor occur over additionally generated interconnects and a method of producing such circuits.

2. Prior Art

Integrated semiconductor circuits with bipolar transistors and MOS field effect transistors on a chip, as well as some of their potential applications, are described in an article by Russell and Frederiksen, *Electronics*, (June 8, 1978) pages 113–117 and in an insert report by L. Mattera, page 114.

The smallest possible dimensions of bipolar transistors are determined by the relatively coarse metallization grid utilized because contacts, both to the emitter and collector zones, as well as to a base zone, must be produced from this metal interconnect level.

There have been many attempts to alleviate the wiring or interconnect problem by means of, for example, a polysilicon wiring, as described in an article by D. D. Tang et al appearing in *IEEE Transactions On Electron Devices*, Vol. ED-27, No. 8, (August 1980) pages 1379–1384 or by means of a polycide wiring, as described in an article by Y. Sasaki et al appearing in *IEEE Transactions On Electron Devices*, Vol. ED-27, No. 8, (August 1980) pages 1385–1389. However, polysilicon interconnects are relatively high-resistant and result in high intermediate resistances. Since the emitter is generally diffused out of the polysilicon in this procedure and because the $n^+$ and $p^+$ dopants diffuse into one another, a high emitter/base capacitance also occurs and vitiates the limiting frequency. The use of a wiring composed of molybdenum silicide, as suggested in the earlier referenced Sasaki et al article, does indeed considerably reduce the wiring resistance in comparison to that of a polysilicon wiring; however, the process of producing this type of wiring is very mask-intensive.

SUMMARY OF THE INVENTION

The invention provides an integrated semiconductor circuit with bipolar transistors and MOS transistors, and, with low sheet resistances of diffusion regions, whose production process occurs without greatly added expenditures and whereby the contacting end connection of the base, emitter and collector regions is independent of the metallization grid, i.e. requires relatively little space, and therefore allows a high packing density.

The invention also provides a process for producing a circuit of the initially referenced type, with method steps which are as simple and mask-saving as possible.

In accordance with the principles of the invention, emitter and collector contacts of a bipolar transistor, as well as the gate electrode of a MOS transistor are composed of the same material, which preferably is a silicide of a hmp (high melting point) metal, such as tantalum, tungsten, molybdenum or titanium.

In addition to the independence from the metallization grid and the low-resistance of the additional wiring thereby achieved, the utilization (only partial) of silicide wiring in conjunction with the high temperature stability of the silicides, enables its simultaneous use as an implantation mask. As a result, the advantages of an additional wiring can be exploited without exertion of additional photo-lithographic steps. The base contact photo-mask can also be eliminated.

By following the principles of the invention, one can readily produce p-channel MOS-FETs for bipolar/MOS applications on the same chip of the bipolar transistor without added outlay.

BRIEF DESCRIPTION OF THE DRAWINGS

FIGS. 1–3 are partial, elevated, cross-sectional, schematic views of a semiconductor chip undergoing processing in accordance with the principles of the invention.

DESCRIPTION OF PREFERRED EMBODIMENTS

The invention will be further described by setting forth a process sequence for fabricating an inventive circuit with a npn-bipolar transistor and a p-channel MOS field effect transistor.

In this description, only the process steps considered essential for an understanding of the invention are illustrated in the drawings, with the same reference numerals being utilized throughout for identical parts or components.

FIG. 1

Active regions of a desired circuit are defined on a monocrystalline, p-doped, (100)-oriented silicon substrate wafer or chip 1 having a specific resistance in the range of about 10 ohm . cm by producing first and second $n^+$-doped zones 2 and 2' with masked ion implantation. A $n^-$-doped silicon layer 3 having a specific electrical resistance in the range of about 2 ohm . cm is then applied on the $n^+$-doped 2 and 2' by an epitaxial deposition technique and an insulation trough or well is etched by use of a mask covering the active regions 2 and 2'. Thereafter, an insulating oxide 4 is generated in the region of the insulation trough. After application of a layer masking to the remaining regions of the bipolar transistor, an $n^+$ deep diffusion zone 5 over a portion of the zone 2 serving as a collector region of the bipolar transistor is produced as a deep diffusion collector. A channel implantation with, for example, phosphorous ions, subsequently is executed for the MOS-FET in surface-wide fashion to adjust MOSFET threshold voltage, if needed. A base zone 6 is generated with p-doping ions, preferably boron ions, after the removal of the previously mentioned mask for the deep diffusion collector zone 5 and after application of another mask for the base implantation. Thereafter an oxide layer 7 is applied as shown in FIG. 1.

Next, a photo-lithographic process is carried out for defining an emitter zone 8, by removing a portion of the oxide layer 7 above zone 6, and for defining an opening over zone 5 for collector contact, all as shown in FIG. 2.

FIG. 2

The emitter zone 8 is now generated by implantation and diffusion of, for example, arsenic ions. A photolithographic process is executed by use of a metal layer 10 for defining a contact 10A for emitter zone 8 and for defining a contact 10B for collector zones 2, 5 as well as the gate electrode 9 for a MOS transistor 18 (best seen in FIG. 3) (portions of the oxide layer 7 over the emitter 8 and over the collector zone 5 being removed as described above). A metal silicide, in an exemplary embodiment preferably composed of tantalum silicide, is applied as metal layer 10 surface-wide in a layer thickness in the range of about 200 nm and is structured such that it functions as contacts 10A and 10B in the bipolar transistor region 17 and as the gate electrode 9 in the MOS transistor region 18 and functions as an implantation mask in the area of the bipolar transistor during a subsequent implantation of base contact region 11 and during generation of the source/drain zones 13, 14 in the area of the MOS transistor 18. Thereafter, an annealing process is executed and the structured silicide layer 10 is crystallized while the implanted ions are simultaneously electronically activated.

FIG. 3

After deposition of an insulation layer 15, functioning as an intermediate oxide, contact hole regions for the base contact 16 of the bipolar transistor 17, and source and drain contacts 20 and 21 for the source/drain zones 13, 14 of the MOS transistor 18 are etched free. Finally, metallization and structuring of an outer metal interconnect level 19 is carried out in a known manner to produce said base contact 16 and source and drain contacts 20 and 21. A layer composed of aluminum can be used for this purpose.

The bracket 17 in FIG. 3 schematically indicates the npn bipolar transistor area while the bracket 18 schematically indicates the p-channel MOS transistor area.

The silicide layer 10 can be composed of hmp metals selected from the group consisting of titanium, molybdenum, tungsten and, of course, tantalum.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

We claim as our invention:

1. A method for producing an integrated semiconductor circuit having at least one npn bipolar transistor and at least one p-channel MOS field effect transistor in a p-doped silicon substrate, comprising steps of:
   (a) defining an active region of said circuit by producing first and second n+-doped zones spaced from one another in the substrate by masked ion implantation;
   (b) applying an epitaxial n−-doped layer on the first and second n+-doped zones;
   (c) etching an insulation trough in a region between the n+-doped zones;
   (d) providing an insulating oxide in the insulation trough;
   (e) by use of a mask providing an n+ deep diffusion through the epitaxial n−-doped layer to the first n+-doped zone, said first n+-doped zone serving as a collector region of the bipolar transistor;
   (f) removing the mask for the deep diffusion, and applying another mask for a base implantation in the bipolar transistor, and then generating a base zone with p-doping ions in the bipolar transistor;
   (g) applying an oxide layer on the surface of the substrate and with a photo-lithographic process defining an emitter zone by removing a portion of the oxide layer above the base zone and defining an opening for a collector contact by removing a portion of the oxide layer above the n+ deep diffusion zone;
   (h) generating the emitter zone by ion implantation and diffusion of n-doping ions;
   (i) depositing a surface-wide silicide layer and structuring the silicide layer by a photolithographic process to define an emitter zone contact and collector zone contact for the bipolar transistor and a gate electrode for the MOS transistor;
   (j) using the structured silicide layer as an implantation mask for a base contact region implantation and for generation of source and drain zones in the MOS transistor;
   (k) annealing the structured silicide layer;
   (l) applying an insulation layer as an intermediate oxide;
   (m) etching contact hole regions through the insulation layer for a base contact and source and drain contacts; and
   (n) providing a metallization structuring of an outer metal interconnect level so as to form said base contact, source contact, and drain contact.

2. A method according to claim 1 wherein subsequent to the n+ deep diffusion, a channel implantation is executed with p-doping ions and a channel of the MOSFET to adjust a threshold voltage thereof.

3. A method according to claim 1 wherein during the annealing process, the structured silicide layer is crystallized and implanted ions are simultaneously electronically activated.

4. A method according to claim 1 wherein said silicide layer is silicide of a metal selected from the group consisting of tantalum, titanium, tungsten, and molybdenum.

5. A method according to claim 1 wherein for the emitter zone implantation arsenic ions are employed, and for the base contact implantation and source and drain implantations boron ions are employed.

6. A method according to claim 1 wherein the outer metal interconnect level employs aluminum.

7. A method according to claim 1 wherein the silicon substrate comprises a (100) oriented, p-doped silicon substrate having a specific resistivity in a range of 10 $\Omega$.cm.

8. A method according to claim 1 wherein the n−-doped epitaxial layer has a specific resistivity of about 2 $\Omega$.cm.

9. A method according to claim 1 wherein the silicide layer has a layer thickness of about 200 mm.

10. A method according to claim 1 wherein said silicide layer comprises tantalum silicide.

11. A method for producing an integrated semiconductor circuit having at least one bipolar transistor and at least one first conductivity type channel MOS field effect transistor in a first conductivity type doped silicon substrate, comprising steps of:
  (a) defining an active region of said circuit by producing first and second second conductivity type doped zones spaced from one another in the substrate;
  (b) applying an epitaxial second conductivity type doped layer on the first and second second conductivity type doped zones;
  (c) etching an insulation trough in a region between the second conductivity type doped zones;
  (d) providing an insulating oxide in the insulation trough;
  (e) providing a second conductivity type deep diffusion through the epitaxial second conductivity type doped layer to the first second conductivity type doped zone, said first second conductivity type doped zone serving as a collector region of the bipolar transistor;
  (f) generating a base zone with first conductivity type doping ions in the bipolar transistor;
  (g) applying an oxide layer on the surface of the substrate and defining an emitter zone by removing a portion of the oxide layer above the base zone and defining an opening for a collector contact by removing a portion of the oxide layer above the second conductivity type deep diffusion zone;
  (h) generating the emitter zone by use of second conductivity type doping ions;
  (i) depositing a surface-wide silicide layer and structuring the silicide layer to define an emitter zone contact and collector zone contact for the bipolar transistor and a gate electrode for the MOS transistor;
  (j) using the structured silicide layer as a mask for generating a base contact region and for generation of source and drain zones in the MOS transistor;
  (k) applying an insulation layer as an intermediate oxide;
  (l) etching contact hole regions through the insulation layer for a base contact and source and drain contacts; and
  (m) providing a metallization structuring of an outer metal interconnect level so as to form said base contact, source contact, and drain contact.

* * * * *